United States Patent
Mikami

(10) Patent No.: US 12,453,066 B2
(45) Date of Patent: Oct. 21, 2025

(54) ELECTROMAGNETIC WAVE SHIELDING MATERIAL, ELECTRONIC COMPONENT, AND ELECTRONIC APPARATUS

(71) Applicant: FUJIFILM Corporation, Tokyo (JP)

(72) Inventor: Tatsuo Mikami, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 35 days.

(21) Appl. No.: 18/523,491

(22) Filed: Nov. 29, 2023

(65) Prior Publication Data

US 2024/0107728 A1    Mar. 28, 2024

Related U.S. Application Data

(63) Continuation of application No. PCT/JP2022/019489, filed on May 2, 2022.

(30) Foreign Application Priority Data

May 31, 2021    (JP) .................... 2021-091631

(51) Int. Cl.
| | | |
|---|---|---|
| H05K 9/00 | (2006.01) | |
| B32B 3/08 | (2006.01) | |
| B32B 7/025 | (2019.01) | |
| B32B 7/12 | (2006.01) | |
| H01F 1/26 | (2006.01) | |
| B32B 15/08 | (2006.01) | |

(52) U.S. Cl.
CPC ............ *H05K 9/0084* (2013.01); *B32B 3/08* (2013.01); *B32B 7/025* (2019.01); *B32B 7/12* (2013.01); *H01F 1/26* (2013.01); *B32B 15/08* (2013.01); *B32B 2307/212* (2013.01)

(58) Field of Classification Search
None
See application file for complete search history.

(56) References Cited

U.S. PATENT DOCUMENTS 12,238,912 B2 * 2/2025 Tsai .................... B60L 50/64
2019/0393161 A1 * 12/2019 Zhong ................ H05K 9/0084

FOREIGN PATENT DOCUMENTS

| JP | H3-6898 A | 1/1991 |
| JP | 2013-53029 A | 3/2013 |
| JP | 2021-28940 A | 2/2021 |

OTHER PUBLICATIONS

International Search Report dated Aug. 2, 2022, issued in International Application No. PCT/JP2022/019489.
Written Opinion dated Aug. 2, 2022, issued in International Application No. PCT/JP2022/019489.
International Preliminary Report on Patentability (with translation of Written Opinion) dated Nov. 21, 2023, issued in International Application No. PCT/JP2022/019489.

* cited by examiner

*Primary Examiner* — Hung V Ngo
(74) *Attorney, Agent, or Firm* — Sughrue Mion, PLLC

(57) ABSTRACT

There is provided an electromagnetic wave shielding material including a multilayer structure having a magnetic layer containing magnetic particles, between two metal layers, in which a part or whole of an edge surface of the magnetic layer is coated with a coating material.

11 Claims, 2 Drawing Sheets

ELECTROMAGNETIC WAVE SHIELDING MATERIAL, ELECTRONIC COMPONENT, AND ELECTRONIC APPARATUS

CROSS-REFERENCE TO RELATED APPLICATIONS

This application is a Continuation of PCT International Application No. PCT/JP2022/019489 filed on May 2, 2022, which claims priority under 35 U.S.C. § 119(a) to Japanese Patent Application No. 2021-091631 filed on May 31, 2021. Each of the above applications is hereby expressly incorporated by reference, in its entirety, into the present application.

BACKGROUND OF THE INVENTION

1. Field of the Invention

The present invention relates to an electromagnetic wave shielding material, an electronic component, and an electronic apparatus.

2. Description of the Related Art

An electromagnetic wave shielding material has attracted attention as a material for reducing the influence of an electromagnetic wave in various electronic components and various electronic apparatuses (see, for example, JP1991-6898A (JP-H3-6898A).

SUMMARY OF THE INVENTION

An electromagnetic wave shielding material (hereinafter, also described as a "shielding material") is capable of exhibiting performance of shielding electromagnetic waves (shielding ability) by reflecting electromagnetic waves incident on the shielding material by the shielding material and/or by attenuating the electromagnetic waves in the inside the shielding material.

The following two performances can be mentioned as the performance desired for the electromagnetic wave shielding material.

The first is that a high shielding ability can be exhibited against electromagnetic waves. An electromagnetic wave shielding material that exhibits a high shielding ability against electromagnetic waves is desirable since it can contribute to significantly reducing the influence of electromagnetic waves on an electronic component and an electronic apparatus. Regarding this point, according to the study by the inventors of the present invention, further improvement in the shielding ability against particularly a magnetic field wave among electromagnetic waves is desired in many electromagnetic wave shielding materials in the related art.

The second is that after being incorporated into an electronic component or an electronic apparatus, the electromagnetic wave shielding material hardly causes the deterioration of the performance of the electronic component or the electronic apparatus.

In consideration of the above circumstances, one aspect of the present invention aims to provide an electromagnetic wave shielding material that is capable of exhibiting a high shielding ability against electromagnetic waves particularly against a magnetic field wave and hardly causes the deterioration of the performance of the electronic component or the electronic apparatus after being incorporated into the electronic component or the electronic apparatus.

One aspect of the present invention relates to:
an electromagnetic wave shielding material comprising;
a multilayer structure having a magnetic layer containing magnetic particles, between two metal layers,
in which a part or whole of an edge surface of the magnetic layer is coated with a coating material.

In one form, a part or whole of the coating material can be a coating material having a thermal conductivity higher than a thermal conductivity of the magnetic layer.

In one form, a part or whole of the coating material can be a conductive coating material.

In one form, the magnetic layer can have a sheet shape having an upper surface, a lower surface, and four edge surfaces, a surface of one metal layer of the two metal layers can face the upper surface, a surface of the other metal layer thereof can face the lower surface, and a part or entire surface of one or more edge surfaces of the four edge surfaces can be coated with the coating material.

In one form, an entire surface of each of the four edge surfaces can be coated with the coating material.

In one form, a part or entire surface of one or more edge surfaces of the four edge surfaces can be coated with a conductive coating material.

In one form, a part or entire surface of one or more edge surfaces of the four edge surfaces can be coated with a coating material having a thermal conductivity higher than a thermal conductivity of the magnetic layer.

In one form, an entire surface of each of the four edge surfaces can be coated with a conductive coating material having a thermal conductivity higher than a thermal conductivity of the magnetic layer.

In one form, the magnetic particle can include a metal particle.

In one form, the magnetic layer can further contain a resin.

One aspect of the present invention relates to an electronic component including the electromagnetic wave shielding material.

One aspect of the present invention relates to an electronic apparatus including the electromagnetic wave shielding material.

According to one aspect of the present invention, it is possible to provide an electromagnetic wave shielding material that is capable of exhibiting a high shielding ability against electromagnetic waves particularly against a magnetic field wave and hardly causes the deterioration of the performance of the electronic component or the electronic apparatus after being incorporated into the electronic component or the electronic apparatus. In addition, according to one aspect of the present invention, it is possible to provide an electronic component and an electronic apparatus, which include the electromagnetic wave shielding material.

DESCRIPTION OF THE PREFERRED EMBODIMENTS

[Electromagnetic Wave Shielding Material]

Figure 1:
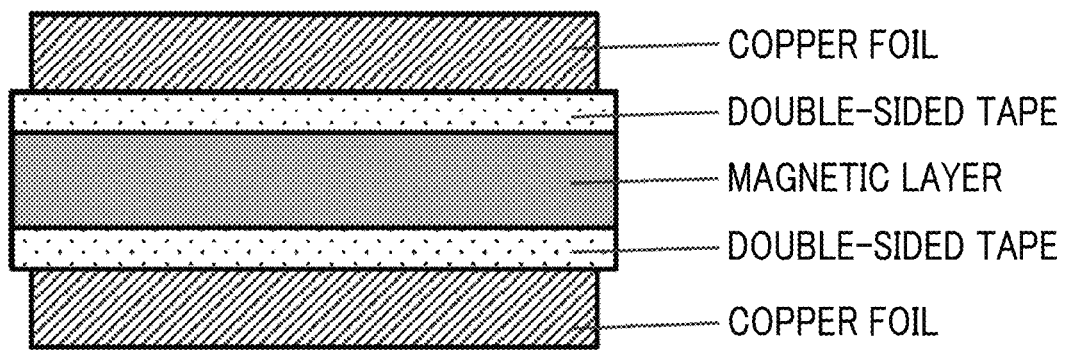
FIG. 1 shows a schematic cross-sectional view of a laminate having a multilayer structure, which is included in an electromagnetic wave shielding material of Example 1.

One aspect of the present invention relates to an electromagnetic wave shielding material including a multilayer structure having a magnetic layer containing magnetic particles, between two metal layers. In the electromagnetic wave shielding material, at least a part of an edge surface of the magnetic layer is coated with a coating material.

In the present invention and the present specification, the "electromagnetic wave shielding material" shall refer to a material that is capable of exhibiting a shielding ability against an electromagnetic wave of at least one frequency or at least a part of a frequency band. The "electromagnetic wave" includes a magnetic field wave and an electric field wave. The "electromagnetic wave shielding material" is preferably a material that is capable of exhibiting a shielding ability against one or both a magnetic field wave of at least one frequency or at least a part of a frequency band and an electric field wave of at least one frequency or at least a part of a frequency band, and it is more preferably a material that is capable of exhibiting a shielding ability against a magnetic field wave in a wider frequency band and/or an electric field wave in a wider frequency band, where it is more preferable that a higher shielding ability can be exhibited.

In the present invention and the present specification, "magnetic" means having a ferromagnetic property. Details of the magnetic layer will be described later.

In the multilayer structure, the magnetic layer is positioned between two metal layers. Accordingly, in a case where one of a pair of surfaces of the magnetic layer is referred to as an upper surface and the other thereof is referred to as a lower surface, a surface of one metal layer of the two metal layers faces the upper surface, and a surface of the other metal layer faces the lower surface. The "edge surface" of such a magnetic layer is a surface that does not face the surface of the metal layer, that is, a side surface. It is noted that the terms "upper surface" and "lower surface" are used as terms for indicating a relative positional relationship between a pair of surfaces of the magnetic layer, and thus the electromagnetic wave shielding material is not limited to being used in a state where the upper surface and the lower surface are disposed parallel to a horizontal plane.

In the present invention and the present specification, the "metal layer" shall refer to a layer containing a metal. The metal layer can be a layer containing one or more kinds of metals as a pure metal consisting of a single metal element, as an alloy of two or more kinds of metal elements, or as an alloy of one or more kinds of metal elements and one or more kinds of non-metal elements. Details of the metal layer will be described later.

The thickness of each layer included in the electromagnetic wave shielding material and the thickness of the coating material can be determined by imaging a cross section exposed by a known method with a scanning electron microscope (SEM) and determining an arithmetic average of thicknesses of five randomly selected points in the obtained SEM image.

Regarding the electromagnetic wave shielding material, the inventors of the present invention presume that the reason why the electromagnetic wave shielding material is capable of exhibiting a high shielding ability against electromagnetic waves is due to the fact that the electromagnetic wave shielding material has a multilayer structure in which a magnetic layer is sandwiched between two metal layers. The details are as follows. In order to obtain a high shielding ability against electromagnetic waves in the electromagnetic wave shielding material, it is desirable to increase the reflection at the interface in addition to increasing the ability to attenuate electromagnetic waves. That is, it is desirable that the electromagnetic wave repeatedly reflects at the interface and passes through the shielding material a large number of times to be largely attenuated. However, as the behavior of the metal layer and the magnetic layer with respect to the electromagnetic wave, the reflection of the magnetic field wave at the interface tends to be small although the metal layer has a large ability to attenuate the electromagnetic wave, and the reflection of the magnetic field wave at the interface tends to be larger than that in the metal layer although the magnetic layer has a smaller ability to attenuate the electromagnetic wave than the metal layer. Therefore, with the metal layer alone or the magnetic layer alone, it is difficult to achieve both high reflection and high attenuation of, particularly, the magnetic field wave among the electromagnetic waves. On the other hand, due to including a multilayer structure having the magnetic layer between two metal layers, the electromagnetic wave shielding material makes it possible to achieve both the above-described reflection at the interface and the above-described attenuation within the layer. The inventors of the present invention conceive this fact is the reason why the electromagnetic wave shielding material is capable of exhibiting a high shielding ability against magnetic field waves. However, the present invention is not limited to the presumption described in the present specification.

Further, the inventors of the present invention conceive that, in the electromagnetic wave shielding material, the fact that a part or whole of the edge surface of the magnetic layer is coated with a coating material contributes to the fact that this electromagnetic wave shielding material hardly causes the deterioration of the performance of the electronic component or the electronic apparatus after being incorporated into the electronic component or the electronic apparatus. The details are as follows. The magnetic layer contains magnetic particles. For example, in a case where many magnetic particles fall off from the edge surface of the magnetic layer due to aged deterioration, there is a possibility that the deterioration of the circuit performance occurs in the electronic component or the electronic apparatus due to the adhesion of the magnetic particles that have fallen off. On the other hand, in the electromagnetic wave shielding material, a part or whole of the edge surface of the magnetic layer containing the magnetic particles is covered with a coating material, and thus it is possible to prevent the magnetic particles from falling off from the edge surface, or it is possible to reduce the quantity of magnetic particles that fall off from the edge surface. Therefore, the inventors of the present invention presume that the electromagnetic wave shielding material hardly causes the deterioration of the performance of the electronic component or the electronic apparatus after being incorporated into the electronic component or the electronic apparatus.

Hereinafter, the electromagnetic wave shielding material will be described in more detail.

<Magnetic Layer>

The magnetic layer is a layer containing magnetic particles. As the magnetic particle, one kind selected from the group consisting of magnetic particles generally called soft magnetic particles, such as metal particles and ferrite particles, can be used, or two or more kinds therefrom can be used in combination. Since the metal particles generally have a saturation magnetic flux density of about 2 to 3 times as compared with ferrite particles, the metal particles can maintain specific magnetic permeability and exhibit shielding ability even under a strong magnetic field without magnetic saturation. Therefore, the magnetic particles to be contained in the magnetic layer are preferably metal particles. In the present invention and the present specification, a layer containing metal particles as the magnetic particles shall correspond to the "magnetic layer".

Metal Particle

In the present invention and the present specification, the "metal particle" includes a pure metal particle consisting of a single metal element, a particle of an alloy of one or more metal elements, one or two more other metal elements, and/or a non-metal element. The metal particle may be or may not be crystalline. That is, the metal particle may be a crystalline particle or may be an amorphous particle. Examples of the element of the metal or non-metal contained in the metal particles include Ni, Fe, Co, Mo, Cr, Al, Si, B, and P. The metal particle may or may not contain a component other than the constitutional elements of the metal (including the alloy). The metal particle may contain, in addition to the constitutional element of the metal (including the alloy), elements contained in an additive that can be optionally added and/or elements contained in impurities that can be unintentionally mixed in a manufacturing process of the metal particle at any content. In the metal particle, the content of the constitutional element of the metal (including the alloy) is preferably 90.0% by mass or more and more preferably 95.0% by mass or more, and it may be 100% by mass or may be less than 100% by mass, 99.9% by mass or less, or 99.0% by mass or less.

Examples of the metal particles include particles of Sendust (an Fe—Si—Al alloy), a permalloy (an Fe—Ni alloy), a molybdenum permalloy (an Fe—Ni—Mo alloy), a Fe—Si alloy, a Fe—Cr alloy, an Fe-containing alloy generally called the iron-based amorphous alloy, a Co-containing alloys generally called the cobalt-based amorphous alloy, an alloy generally called the nanocrystal alloy, iron, Permendur (an Fe—Co alloy). Among them, Sendust is preferable since it exhibits a high saturation magnetic flux density and a high specific magnetic permeability.

In one form, a magnetic layer exhibiting a high magnetic permeability (specifically, a real part of a complex specific magnetic permeability) is preferable. In a case where a complex specific magnetic permeability is measured by a magnetic permeability measuring apparatus, a real part $\mu'$ and an imaginary part $\mu''$ are generally displayed. In the present invention and the present specification, a real part of a complex specific magnetic permeability shall refer to such a real part $\mu'$. Hereinafter, a real part of a complex specific magnetic permeability at a frequency of 100 kHz is also simply referred to as "magnetic permeability". The magnetic permeability can be measured by a commercially available magnetic permeability measuring apparatus or a magnetic permeability measuring apparatus having a known configuration. From the viewpoint that still more excellent electromagnetic wave shielding ability can be exhibited, it is preferable that the magnetic layer positioned between the two metal layers is a magnetic layer having a magnetic permeability (the real part of the complex specific magnetic permeability at a frequency of 100 kHz) of 30 or more. The magnetic permeability thereof is more preferably 40 or more, still more preferably 50 or more, still more preferably 60 or more, even more preferably 70 or more, even still more preferably 80 or more, even still more preferably 90 or more, and even further still more preferably 100 or more. In addition, the magnetic permeability can be, for example, 200 or less, 190 or less, 180 or less, 170 or less, or 160 or less, and it can exceed the values exemplified here. The higher the magnetic permeability is, the higher interfacial reflection effect is obtained, which is preferable.

From the viewpoint of forming a magnetic layer exhibiting a high magnetic permeability, the magnetic particle is preferably a particle having a flat shape (flat-shaped particle). In a case of arranging the long side direction of the flat-shaped particles to be closer to a state parallel to the in-plane direction of the magnetic layer, the magnetic layer can exhibit a higher magnetic permeability since the diamagnetic field can be reduced by aligning the long side direction of the particle with the vibration direction of the electromagnetic wave incident orthogonal to the electromagnetic wave shielding material. In the present invention and the present specification, the "flat-shaped particle" refers to a particle having an aspect ratio of 0.20 or less. The aspect ratio of the flat-shaped particles is preferably 0.15 or less, and more preferably 0.10 or less. The aspect ratio of the flat-shaped particles can be, for example, 0.01 or more, 0.02 or more, or 0.03 or more. It is possible to make the shape of the particle flat-shaped by carrying out the flattening process according to a known method. For the flattening process, for example, the description of JP2018-131640A can be referenced, and specifically, the description of paragraphs 0016 and 0017 and the description of Examples of the same publication can be referenced. Examples of the magnetic layer exhibiting a high magnetic permeability include a magnetic layer containing flat-shaped particles of Sendust.

As described above, from the viewpoint of forming a layer exhibiting a high magnetic permeability as the magnetic layer, it is preferable to arrange the long side direction of the flat-shaped particles to be closer to a state parallel to the in-plane direction of the magnetic layer. From this point, the alignment degree which is a sum of an absolute value of the average value of alignment angles of the flat-shaped particles with respect to the surface of the magnetic layer and a variance of the alignment angles is preferably 30° or lower, more preferably 25° or lower, still more preferably 20° or lower, and particularly preferably 15° or lower. The alignment degree can be, for example, 3° or higher, 5° or higher, or 10° or higher, and it can be lower than the values exemplified here. A method of controlling the alignment degree will be described later.

In the present invention and the present specification, the aspect ratio of the magnetic particle and the alignment degree are determined according to the following methods.

A cross section of a magnetic layer is exposed according to a known method. A cross-sectional image is acquired as an SEM image regarding a randomly selected region of the cross-section. The imaging conditions are set to be an acceleration voltage of 2 kV and a magnification of 1,000 times, and an SEM image is obtained as the backscattered electron image.

Reading is carried out in grayscale with the cv2.imread ( ) function of Image processing library OpenCV 4 (manufactured by Intel Corporation) by setting the second argument to 0, and a binarized image is obtained with the cv2.threshold ( ) function, using an intermediate brightness between the high-brightness portion and the low-brightness portion as a boundary. A white portion (high-brightness portion) in the binarized image is defined as a magnetic particle.

Regarding the obtained binarized image, a rotational circumscribed rectangular shape corresponding to a portion of each magnetic particle is determined according to the cv2.minAreaRect ( ) function, and the long side length, the short side length, and the rotation angle are determined as the return values of the cv2. minAreaRect ( ) function. In a case of determining the total number of magnetic particles included in the binarized image, it shall be assumed that particles in which only a part of the particle is included in the binarized image are also included. Regarding the particles in which only a part of the particle is included in the binarized image, the long side length, the short side length, and the rotation angle of the portion included in the binarized image are determined. The ratio of the short side length to the long side length (short side length/long side length) determined in this way shall be denoted as the aspect ratio of each magnetic particle. In the present invention and the present specification, in a case where the number of magnetic particles which have an aspect ratio of 0.20 or less and is defined as flat-shaped particles is 10% on a number basis with respect to the total number of magnetic particles included in the binarized image, it shall be determined that the magnetic layer is a "magnetic layer including flat-shaped particles as the magnetic particles". In addition, from the rotation angle determined as above, an "alignment angle" is determined as a rotation angle with respect to a horizontal plane (the surface of the magnetic layer).

Particles having an aspect ratio of 0.20 or less, which are determined in the binarized image, are defined as flat-shaped particles. Regarding the alignment angles of all the flat-shaped particles included in the binarized image, the sum of the absolute value of the average value (arithmetic average) and the variance is determined. The sum determined in this way is referred to as the "alignment degree". It is noted that the coordinates of the circumscribed rectangle are calculated using the cv2. boxPoints ( ) function, and an image in which the rotational circumscribed rectangle is superposed on the original image is created according to the cv2. drawContours ( ) function, where a rotational circumscribed rectangle that is erroneously detected clearly is excluded from the calculation of the aspect ratio and the alignment degree. In addition, an average value (arithmetic average) of the aspect ratios of the particles defined as the flat-shaped particles shall be denoted as the aspect ratio of the flat-shaped particles to be contained in a magnetic layer to be measured. Such an aspect ratio is 0.20 or less, preferably 0.15 or less, and more preferably 0.10 or less. In addition, the aspect ratio can be, for example, 0.01 or more, 0.02 or more, or 0.03 or more.

The content of the magnetic particles in the magnetic layer is, for example, 50% by mass or more, 60% by mass or more, 70% by mass or more, and 80% by mass or more with respect to the total mass of the magnetic layer, and it can be, for example, 100% by mass or less, 98% by mass or less, or 95% by mass or less.

In one form, as the magnetic layer, a sintered body (a ferrite plate) of ferrite particles or the like can be used. Considering that there is a case where the electromagnetic wave shielding material is cut out to a desired size, a case where the electromagnetic wave shielding material is bent into a desired shape, and the like, the magnetic layer is preferably a layer that contains a resin as compared with a ferrite plate which is a sintered body.

In one form, the magnetic layer positioned between the two metal layers can be a layer having insulating properties. In the present invention and the present specification, the "insulating properties" associated with the magnetic layer refer to that the electrical conductivity is smaller than 1 siemens (S)/m. The electrical conductivity of a certain layer is calculated according to the following expression from the surface electrical resistivity of the layer and the thickness of the layer. The electrical conductivity can be measured by a known method.

Electrical conductivity [S/m]=1/(surface electrical resistivity [Ω]×thickness [m])

The inventors of the present invention presume that it is preferable that the magnetic layer is a layer having insulating properties in order for the electromagnetic wave shielding material to exhibit a higher electromagnetic wave shielding ability. From this point, the electrical conductivity of the magnetic layer is preferably smaller than 1 S/m, more preferably 0.5 S/m or less, still more preferably 0.1 S/m or less, and even still more preferably 0.05 S/m or less. The electrical conductivity of the magnetic layer can be, for example, $1.0 \times 10^{-12}$ S/m or more or $1.0 \times 10^{-10}$ S/m or more.

(Resin)

The magnetic layer can be a layer containing a resin. In the magnetic layer containing the magnetic particles and the resin, the content of the resin can be, for example, 1 part by mass or more, 3 parts by mass or more, or 5 parts by mass or more per 100 parts by mass of the magnetic particles, and it can be 20 parts by mass or less or 15 parts by mass or less.

The resin can act as a binder in the magnetic layer. Examples of the resin to be contained in the magnetic layer include known thermoplastic resins in the related art, a thermosetting resin, an ultraviolet curable resin, a radiation curable resin, a rubber-based material, and an elastomer. Specific examples thereof include a polyester resin, a polyethylene resin, a polyvinyl chloride resin, a polyvinyl butyral resin, a polyurethane resin, a cellulose resin, an acrylonitrile-butadiene-styrene (ABS) resin, a nitrile-butadiene rubber, a styrene-butadiene rubber, an epoxy resin, a phenol resin, an amide resin, a styrene-based elastomer, an olefin-based elastomer, a vinyl chloride-based elastomer, a polyester-based elastomer, a polyamide-based elastomer, a polyurethane-based elastomer, and an acrylic elastomer.

The electromagnetic wave shielding material can be used, for example, by being bent into any shape. In a case where the magnetic layer breaks in a case where the shielding material is bent, the shielding ability may deteriorate at the broken place. Therefore, a magnetic layer, which has excellent breakage resistance and is difficult to break during bending, is desirable. From the viewpoint of improving the breakage resistance of the magnetic layer, the magnetic layer is preferably a layer containing a resin having a glass transition temperature Tg of 50° C. or lower. In the present invention and the present specification, the glass transition temperature Tg is determined as the baseline shift start temperature of a heat flow chart at the time of temperature rise from the measurement result of the heat flow measurement using a differential scanning calorimeter. From the viewpoint of further improving the breakage resistance of the magnetic layer, the glass transition temperature Tg of the resin to be contained in the magnetic layer is more preferably 40° C. or lower, still more preferably 30° C. or lower, still more preferably 20° C. or lower, still more preferably 10° C. or lower, even still more preferably 0° C. or lower, and even further still more preferably −10° C. or lower. The glass transition temperature Tg of the resin to be contained in the magnetic layer can be, for example, −100° C. or higher, −90° C. or higher, or −80° C. or higher.

In addition to the above-described components, the magnetic layer can also contain any amount of one or more known additives such as a curing agent, a dispersing agent, a stabilizer, and a coupling agent.

<Metal Layer>

The electromagnetic wave shielding material has a multilayer structure including the magnetic layer between two metal layers. The electromagnetic wave shielding material includes one or more such multilayer structures and can also include two or more such multilayer structures. That is, the electromagnetic wave shielding material includes at least two metal layers and can also include three or more metal layers. The two or three or more metal layers included in the electromagnetic wave shielding material have the same composition and thickness in one form and differ in composition and/or thickness in another form. In addition, in a case where the electromagnetic wave shielding material includes two or more layers of the magnetic layer, the two or more magnetic layers have the same composition and thickness in one form and differ in composition and/or thickness in another form.

As the metal layer, a layer containing one or more kinds of metals selected from the group consisting of various pure metals and various alloys can be used. The metal layer can exhibit an attenuation effect in the shielding material. Since the attenuation effect increases as the propagation constant increases and the propagation constant increases as the electrical conductivity increases, it is preferable that the metal layer contains a metal element having a high electrical conductivity. From this point, it is preferable that the metal layer contains a pure metal of Ag, Cu, Au, Al, or Mg, or an alloy containing any one of these as a main component. The pure metal is a metal consisting of a single metal element and may contain a trace amount of impurities. In general, a metal having a purity of 99.0% or more consisting of a single metal element is called a pure metal. The purity is based on mass. The alloy is generally prepared by adding one or more kinds of metal elements or non-metal elements to a pure metal to adjust the composition, for example, in order to prevent corrosion or improve the hardness. The main component in the alloy is a component having the highest ratio on a mass basis, and it can be, for example, a component that occupies 80.0% by mass or more (for example, 99.8% by mass or less) in the alloy. From the viewpoint of economic efficiency, the alloy is preferably an alloy of a pure metal of Cu or Al or an alloy containing Cu or Al as a main component, and from the viewpoint of high electrical conductivity, it is preferably an alloy of a pure metal of Cu or an alloy containing Cu as a main component.

The purity of the metal in the metal layer, that is, the content of the metal can be 99.0% by mass or more, where it is preferably 99.5% by mass or more, and more preferably 99.8% by mass or more with respect to the total mass of the metal layer. Unless otherwise specified, the content of metal in the metal layer shall refer to the content on a mass basis. For example, as the metal layer, a pure metal or an alloy processed into a sheet shape can be used. For example, as the metal layer, a commercially available metal foil or a metal foil produced by a known method can be used. Regarding a pure metal of Cu, sheets (so-called copper foils) having various thicknesses are commercially available. For example, such a copper foil can be used as the metal layer. The copper foil includes, according to manufacturing methods thereof, an electrolytic copper foil obtained by precipitating a copper foil on a cathode by electroplating and a rolled copper foil obtained by applying heat and pressure to an ingot and stretching the ingot thinly. Any copper foil can be used as the metal layer of the electromagnetic wave shielding material. In addition, for example, regarding Al, sheets (so-called aluminum foils) having various thicknesses are commercially available. For example, such an aluminum foil can be used as the metal layer.

From the viewpoint of reducing the weight of the electromagnetic wave shielding material, one or both (preferably both) of the two metal layers included in the multilayer structure is preferably a metal layer containing a metal selected from the group consisting of Al and Mg. This is because a value (specific gravity/electrical conductivity) obtained by dividing the specific gravity by the electrical conductivity is small both in Al and Mg. As a metal in which this value is smaller is used, the weight of the electromagnetic wave shielding material exhibiting a high shielding ability can be further reduced. As a value calculated from the literature value, for example, a value (specific gravity/electrical conductivity) obtained by dividing the specific gravity by the electrical conductivity of each of Cu, Al, and Mg is as follows. Cu: $1.5 \times 10^{-7}$ m/S, Al: $7.6 \times 10^{-8}$ m/S, Mg: $7.6 \times 10^{-8}$ m/S. From the above values, it can be said that Al and Mg are preferred metals from the viewpoint of reducing the weight of the electromagnetic wave shielding material. The metal layer containing a metal selected from the group consisting of Al and Mg can contain only one of Al and Mg in one form and can contain both in another form. From the viewpoint of reducing the weight of the electromagnetic wave shielding material, one or both (preferably both) of the two metal layers included in the multilayer structure are preferably a metal layer in which the content of the metal selected from the group consisting of Al and Mg is 80.0% by mass or more, and still more preferably a metal layer in which the content of the metal selected from the group consisting of Al and Mg is 90.0% by mass or more. The metal layer containing at least Al among Al and Mg can be a metal layer in which the Al content is 80.0% by mass or more, and it can be a metal layer in which the Al content is 90.0% by mass or more. The metal layer containing at least Mg among Al and Mg can be a metal layer in which the Mg content is 80.0% by mass or more, and it can be a metal layer in which the Mg content is 90.0% by mass or more. The content of the metal selected from the group consisting of Al and Mg, the Al content, and the Mg content can be each, for example, 99.9% by mass or less. The content of the metal selected from the group consisting of Al and Mg, the Al content, and the Mg content are each the content with respect to the total mass of the metal layer.

<Specific Example of Layer Configuration>

Specific examples of the layer configuration of the electromagnetic wave shielding material include the following examples.

Example 1: "metal layer/magnetic layer/metal layer"

Example 2: "metal layer/magnetic layer/metal layer/magnetic layer/metal layer"

Example 3: "metal layer/magnetic layer/metal layer/magnetic layer/metal layer/magnetic layer/metal layer"

In an electromagnetic wave shielding material including two or more multilayer structures that includes the magnetic layer between two metal layers, for example, as in Example 2 and Example 3, a metal layer that sandwiches a magnetic layer in a certain multilayer structure can also be a metal layer that sandwiches a magnetic layer in another multilayer structure. In the electromagnetic wave shielding material, the total number of multilayer structures including the magnetic layer between two metal layers can be, for example, 1 to 4. In the above, the symbol "/" is used in the sense of including both the fact that the layer described on the left side and the layer described on the right side of this symbol are in direct contact with each other without another layer being interposed therebetween and that they are indirectly laminated with one or more layers of other layers being interposed therebetween. Specific examples of the other layer include an adhesive layer for adhesion, which will be described later. The total number of the magnetic layers included in the electromagnetic wave shielding material is such that one or more layers are included, two or more layers can be included, and for example, four or less layers can be included. On the other hand, the total number of the metal layers included in the electromagnetic wave shielding material is such that two or more layers are included, and for example, two to five layers can be included.

<Various Thicknesses>

From the viewpoint of the workability of the metal layer and the shielding ability of the electromagnetic wave shielding material, the thickness of the metal layer in terms of the thickness per one layer is preferably 4 µm or more, more preferably 5 µm or more, still more preferably 10 µm or more per layer, still more preferably 15 µm or more, even still more preferably 20 µm or more, and even still more preferably 25 µm or more. On the other hand, from the viewpoint of the processability of the metal layer, the thickness of the metal layer in terms of the thickness per one layer is preferably 100 µm or less, more preferably 50 µm or less, still more preferably 45 µm or less, and even still more preferably 40 µm or less.

In a case where the thickness of one metal layer of the two metal layers that are positioned to sandwich the magnetic layer is denoted as T1, the thickness of the other metal layer is denoted as T2, and T1 is equal to or larger than T2 (that is, T1=T2 or T1>T2), the ratio (T2/T1) of the thickness between the two metal layers can be, for example, 0.10 or more, and it is preferably 0.15 or more, more preferably 0.30 or more, still more preferably 0.50 or more, still more preferably 0.70 or more, and even still more preferably 0.80 or more, from the viewpoint that a higher shielding ability can be exhibited with respect to the magnetic field wave. From the viewpoint that a still higher shielding ability can be exhibited with respect to the magnetic field wave, it is preferable that the difference between T1 and T2 is smaller. The thickness ratio (T2/T1) can be 1.00 or less and can also be 1.00 (that is, T1=T2). In a case where the electromagnetic wave shielding material includes a multilayer structure having the magnetic layer between two metal layers, the above description associated with the thickness ratio (T2/T1) can be applied to at least one of the multilayer structures included in the electromagnetic wave shielding material, can be applied to two or more of them, and can be applied to all of them.

The shielding material can be processed by being bent into any shape according to a use application. In a case where the width of the curved portion (hereinafter, referred to as a "curve width") is widened when the shielding material is bent, the shape of the curved portion becomes a gentle curve shape, and it may be difficult to process the shielding material into an intended shape. From this point, the narrower the curve width is, the more preferable it is. The larger the total thickness of the metal layers included in the shielding material is, the wider the curve width tends to be. From the viewpoint of making the curve width of the shielding material narrow, the total thickness of the metal layers included in the electromagnetic wave shielding material is preferably 100 µm or less, more preferably 90 µm or less, still more preferably 80 µm or less, still more preferably 70 µm or less, even still more preferably 60 µm or less, even further still more preferably 50 µm or less, and even further still more preferably 40 µm or less. The total thickness of the metal layers included in the electromagnetic wave shielding material can be, for example, 8 µm or more or 10 µm or more.

Regarding the thickness of the magnetic layer, the thickness per layer can be, for example, 3 µm or more, where it is preferably 10 µm or more and more preferably 20 µm or more, from the viewpoint of the shielding ability of the electromagnetic wave shielding material. In addition, from the viewpoint of processability of the electromagnetic wave shielding material, the thickness of the magnetic layer per layer can be, for example, 90 µm or less, where it is preferably 70 µm or less and more preferably 50 µm or less. In a case where the electromagnetic wave shielding material includes two or more layers of the magnetic layers, the total thickness of the magnetic layers included in the electromagnetic wave shielding material can be, for example, 6 µm or more and it can be, for example, 180 µm or less.

In addition, the overall thickness of the shielding material can be, for example, 250 µm or less. From the viewpoint of making the curve width narrow, it is also preferable that the overall thickness of the shielding material is small. From this point, the overall thickness of the electromagnetic wave shielding material is preferably 200 µm or less, more preferably 190 µm or less, and still more preferably 170 µm or less. The overall thickness of the electromagnetic wave shielding material can be, for example, 30 µm or more or 40 µm or more.

<Formation of Multilayer Structure>

(Film Formation Method for Magnetic Layer)

The electromagnetic wave shielding material includes a multilayer structure having a magnetic layer containing magnetic particles, between two metal layers. Such a multilayer structure can be produced, for example, by adhering a magnetic layer and a metal layer to each other. The magnetic layer for being adhered to the metal layer can be produced, for example, by drying a coating layer that is proved by applying a composition for forming a magnetic layer. The composition for forming a magnetic layer contains the components described above and can optionally contain one or more kinds of solvents. Examples of the solvent include various organic solvents, for example, ketone-based solvents such as acetone, methyl ethyl ketone, and cyclohexanone, acetic acid ester-based solvent solvents such as ethyl acetate, butyl acetate, cellosolve acetate, propylene glycol monomethyl ether acetate, and carbitol acetate, carbitols such as cellosolve and butyl carbitol, aromatic hydrocarbon-based solvents such as toluene and xylene, and amide-based solvents such as dimethylformamide, dimethylacetamide, and N-methylpyrrolidone. One kind of solvent or two or more kinds of solvents selected in consideration of the solubility of the component that is used in the preparation of the composition for forming a magnetic layer can be mixed at any ratio and used. The solvent content of the composition for forming a magnetic layer is not particularly limited and may be determined in consideration of the coatability of the composition for forming a magnetic layer.

The composition for forming a magnetic layer can be prepared by sequentially mixing various components in any order or simultaneously mixing them. In addition, as necessary, a dispersion treatment can be carried out using a known dispersing machine such as a ball mill, a bead mill, a sand mill, or a roll mill, and/or a stirring treatment can be also carried out using a known stirrer such as a shaking type stirrer.

The composition for forming a magnetic layer can be applied onto, for example, a support. The coating can be carried out using a known coating device such as a blade coater or a die coater. The coating can be carried out by a so-called roll-to-roll method or a batch method.

Examples of the support onto which the composition for forming a magnetic layer is applied include films of various resins such as polyester such as polyethylene terephthalate (PET) and polyethylene naphthalate (PEN), acryls such as polycarbonate (PC) and polymethyl methacrylate (PMMA), cyclic polyolefin, triacetyl cellulose (TAC), polyether sulfide (PES), polyether ketone, and polyimide. For these resin films, reference can be made to paragraphs 0081 to 0086 of JP2015-187260A. As the support, it is possible to use a support in which a surface (a surface to be coated) onto which the composition for forming a magnetic layer is applied is subjected to a peeling treatment according to a known method. One form of the peeling treatment includes forming a release layer. For the release layer, reference can be made to paragraph 0084 of JP2015-187260A. In addition, a commercially available peeling-treated resin film can also be used as the support. In a case of using a support in which the surface to be coated is subjected to the peeling treatment, it is possible to easily separate the magnetic layer and the support after the film formation.

In one form, it is also possible to directly apply the composition for forming a magnetic layer onto the metal layer using the metal layer as a support. In a case of directly applying the composition for forming a magnetic layer onto the metal layer, it is possible to manufacture a laminated structure of the metal layer and the magnetic layer in one step.

A coating layer formed by applying the composition for forming a magnetic layer can be subjected to a drying treatment according to a known method such as heating or warm air blowing. The drying treatment can be carried out, for example, under conditions in which the solvent contained in the composition for forming a magnetic layer can be volatilized. As an example, the drying treatment can be carried out for 1 minute to 2 hours in a heated atmosphere having an atmospheric temperature of 80° C. to 150° C.

The alignment degree of the flat-shaped particle described above can be controlled by a solvent kind, solvent amount, liquid viscosity, coating thickness, and the like of the composition for forming a magnetic layer. For example, in a case where the boiling point of the solvent is low, convection occurs due to drying, and thus the value of the alignment degree tends to be large. In a case where the solvent amount is small, the value of the alignment degree tends to increase due to physical interference between adjacent flat-shaped particles. On the other hand, in a case where the liquid viscosity is low, the rotation of flat-shaped particles is difficult to occur, and thus the value of the alignment degree tends to be small. The value of the alignment degree tends to be small as the coating thickness decreases. In addition, carrying out a pressurization treatment described later can contribute to reducing the value of the alignment degree. In a case of adjusting the various manufacturing conditions described above, the alignment degree of the flat-shaped particles can be controlled within the range described above.

(Pressurization Treatment of Magnetic Layer)

The magnetic layer can also be subjected to a pressurization treatment after film formation. In a case of subjecting the magnetic layer containing the magnetic particles to a pressurization treatment, it is possible to increase the density of the magnetic particles in the magnetic layer, and it is possible to obtain a higher magnetic permeability. In addition, in the magnetic layer containing the flat-shaped particles, it is possible to reduce the value of the alignment degree by the pressurization treatment, and it is possible to obtain a higher magnetic permeability.

The pressurization treatment can be carried out by applying pressure in the thickness direction of the magnetic layer using a flat plate pressing machine, a roll pressing machine, or the like. In the flat plate pressing machine, an object to be pressurized is disposed between two flat press plates that are disposed vertically, and the two press plates are put together by mechanical or hydraulic pressure to apply pressure to the object to be pressurized. In the roll pressing machine, an object to be pressurized is allowed to pass between the rotating pressurization rolls that are disposed vertically, and at that time, mechanical or hydraulic pressure is applied to the pressurization rolls, or the distance between the pressurization rolls is made to be smaller than the thickness of the object to be pressurized, whereby the pressure can be applied.

The pressure during the pressurization treatment can be set freely. For example, in a case of a flat plate pressing machine, it is, for example, 1 to 50 newton (N)/mm$^2$. In a case of a roll pressing machine, it is, for example, 20 to 400 N/mm in terms of the linear pressure.

The pressurization time can be set freely. It takes, for example, 5 seconds to 30 minutes in a case where a flat plate pressing machine is used. In a case where a roll pressing machine is used, the pressurization time can be controlled by the transport speed of the object to be pressurized, where the transport speed is, for example, 10 cm/min to 200 m/min.

The materials of the press plate and the pressurization roll can be randomly selected from metal, ceramics, plastic, and rubber.

In the pressurization treatment, it is also possible to carry out a pressurization treatment by applying a temperature to both of upper and lower press plates of a plate-shape pressing machine or one press plate thereof, or one roll of upper and lower rolls of a roll pressing machine. The magnetic layer can be softened by heating, which makes it possible to obtain a high compression effect in a case where pressure is applied. The temperature at the time of heating can be set freely, and it is, for example, 50° C. or higher and 200° C. or lower. The temperature at the time of heating can be the internal temperature of the press plate or the roll. Such a temperature can be measured with a thermometer installed inside the press plate or the roll.

After the heating and pressurization treatment with the plate-shape pressing machine, the press plates can be spaced apart from each other, for example, in a state where the temperature of the press plates is high, whereby the magnetic layer can be taken out. Alternatively, the press plate can be cooled by a method such as water cooling or air cooling while maintaining the pressure, and then the press plates can be spaced apart to take out the magnetic layer.

In the roll pressing machine, the magnetic layer can be cooled immediately after pressing, by a method such as water cooling or air cooling.

It is also possible to repeat the pressurization treatment two or more times.

In a case where the magnetic layer is formed into a film on a release film, it is possible to carry out a pressurization treatment in a state where the magnetic layer is laminated on the release film. Alternatively, the magnetic layer can also be peeled off from the release film and can be subjected to a pressurization treatment as a single layer of the magnetic layer. In a case where the magnetic layer is formed into a film directly on the metal layer, the pressurization treatment can be carried out in a state where the metal layer and the magnetic layer are superposed. In addition, in a case of carrying out the pressurization treatment in a state where the magnetic layer is disposed between the metal layers, it is also possible to carry out the pressurization treatment of the magnetic layer and the adhesion between the metal layer and the magnetic layer at the same time.

(Adhesion Between Metal Layer and Magnetic Layer)

The metal layer and the magnetic layer adjacent to each other can be directly adhered to each other, for example, by applying pressure and heat to carry out crimping. A flat plate pressing machine, a roll pressing machine, or the like can be used for the crimping. In the crimping step, the magnetic layer is softened, and the contact with the surface of the metal layer is promoted, whereby the two layers adjacent to each other can be adhered to each other. The pressure at the time of crimping can be set freely. It is, for example, 1 to 50 N/mm$^2$ in a case of a flat plate pressing machine. In a case of a roll pressing machine, it is, for example, 20 to 400 N/mm in terms of the linear pressure. The pressurization time at the time of crimping can be set freely. It takes, for example, 5 seconds to 30 minutes in a case where a flat plate pressing machine is used. In a case where a roll pressing machine is used, the pressurization time can be controlled by a transport speed of an object to be pressurized, and the transport speed is, for example, 10 cm/min to 200 m/min. The temperature at the time of crimping can be randomly selected. For example, it is 50° C. or higher and 200° C. or lower.

The metal layer and the magnetic layer adjacent to each other can also be adhered to each other with an adhesive layer being interposed therebetween. The adhesive layer can be formed by using an adhesion means such as a double-sided tape or an adhesive. The general double-sided tape and the adhesive do not affect the shielding ability of the shielding material, or the influence thereof is as small as negligible. Examples of the adhesive means include the double-sided tape described as a silicone-based base material-less double-sided tape in JP2003-20453A. In addition, a double-sided tape and an adhesive, which are commercially available, can also be used. The thickness of the adhesive layer formed from the double-sided tape or the adhesive is not particularly limited; however, it can be, for example, 1 µm or more and 30 µm or less.

<Coating of Edge Surface of Magnetic Layer>

The electromagnetic wave shielding material can have any shape such as a sheet shape (also can be referred to as a film shape) and any size. For example, a sheet-shaped electromagnetic wave shielding material can be bent into any shape and incorporated into an electronic component or an electronic apparatus. In the multilayer structure included in the sheet-shaped electromagnetic wave shielding material, the magnetic layer and the metal layer can also have a sheet shape. The sheet shape can be, for example, a sheet shape having an upper surface, a lower surface, and four edge surfaces, where the surface shapes of the upper surface and the lower surface can be, for example, rectangular. The rectangular upper surface and the rectangular lower surface can have the same size or can have sizes different from each other. It is noted that with regard to the "same size" and the "same" associated with the surface shape described in the present specification, the manufacturing error that can generally occur is allowed. The surface of the metal layer facing the upper surface of the sheet-shaped magnetic layer having an upper surface, a lower surface, and four edge surfaces can have the same size and the same surface shape as the upper surface of the magnetic layer in one form, and in another form, it can be different in size and/or surface shape from the upper surface. Regarding the surface of the metal layer facing the lower surface of the magnetic layer as well, the surface of the metal layer facing the lower surface of the sheet-shaped magnetic layer having an upper surface, a lower surface, and four edge surfaces can have the same size and the same surface shape as the lower surface of the magnetic layer in one form, and in another form, it can be different in size and/or surface shape from the lower surface. For example, in the multilayer structure, the edge surface of the magnetic layer can be in a state of protruding outward from the edge surfaces of the two metal layers in one form, and in another form, it can be in a state of being retracted inward from the end surfaces of the two metal layers. In addition, in another form, the upper and lower surfaces can have the same size and have the same surface shape in both the two metal layers and the magnetic layer, which are included in the multilayer structure. In any case, in the electromagnetic wave shielding material, a part or whole of an edge surface of the magnetic layer is coated with a coating material.

(Coating Material)

As a coating material that coats a part or whole of the edge surface of the magnetic layer, various adhesives, liquid or solid sealing agents, resin films, pressure-sensitive adhesive tapes, metal foils with an adhesive layer, and the like can be used. For example, in a multilayer structure prepared as described above, in a case where a coating material is bonded, by a known method, to a part or whole of the edge surface of the magnetic layer, which is exposed without being coated by the metal layer, the edge surface of the magnetic layer can be coated with the coating material. On the other hand, the edge surface of the metal layer included in the multilayer structure may not be coated with a coating material, or a part or entire surface of the edge surface may be coated with a coating material.

In one form, the coating material that coats the edge surface of the magnetic layer can be only one kind of coating material. In another form, a coating material that coats a part of the edge surface of the magnetic layer and a coating material that coats the other part thereof can be respectively coating materials having thicknesses and/or compositions different from each other. For example, in one form, all four edge surfaces of a sheet-shaped magnetic layer having an upper surface, a lower surface, and four edge surfaces can be coated with the same coating material. In another form, a coating material that coats one or more of the four edge surfaces and a coating material that coats the other one or more thereof can be respectively coating materials having thicknesses and/or compositions different from each other. A part or entire surface of each edge surface can be coated with a coating material. The thickness of the coating material can be, for example, 10 µm or more or 30 µm or more, and can be, for example, 300 µm or less or 200 µm or less.

In one form, a part or whole of the coating material that coats the edge surface of the magnetic layer can be a coating material having a thermal conductivity higher than a thermal conductivity of the magnetic layer. It is preferable to coat a part or whole of the edge surface of the magnetic layer with a coating material having a thermal conductivity higher than a thermal conductivity of the magnetic layer from the viewpoint of improving the heat radiation properties of the electromagnetic wave shielding material. The details are as follows.

In many cases, the shielding material is installed in the vicinity of a component or equipment that generates noise or is installed in contact with such a component or equipment. In general, a large current is used in a component or equipment which strongly generates magnetic field noise, and thus Joule heat can cause the heat generation of the equipment. Therefore, it is more desirable that the shielding material also exhibits a function (heat radiation properties) of radiating the heat generated from the equipment in addition to exhibiting the effect of shielding the magnetic field noise. A shielding material having a high thermal conductivity is excellent in heat radiation properties. However, in a shielding material having a multilayer structure having a magnetic layer between two metal layers, since the thermal conductivity of the magnetic layer is generally smaller than that of the metal layer, the heat transfer is suppressed in the magnetic layer, and as a result, the heat radiation properties as a shielding material are not sufficient in many cases. On the other hand, as a result of diligent studies by the inventors of the present invention, it was found that in a case of setting the thermal conductivity of the coating material on the edge surface to be higher than that of the magnetic layer, it is possible to improve the thermal conductivity of the shielding material. The coating material having a high thermal conductivity can be selected from those containing a material having a high thermal conductivity. Examples of the material having a high thermal conductivity include various metals or ceramics and semiconductors. A simple body or a mixture of these materials having a high thermal conductivity, or a composite thereof with a resin or the like can be used as a coating material having a high thermal conductivity.

A measuring method for the thermal conductivity is classified into a steady state method and a non-steady state method. In the present invention and the present specification, the "thermal conductivity" shall refer to a thermal conductivity measured by a steady state method. Specific examples of the measuring method for the thermal conductivity include a method described for Examples described later can be used.

In the coating material having a thermal conductivity higher than a thermal conductivity of the magnetic layer the thermal conductivity is more than 1.0, preferably 1.2 or more, and more preferably 1.4 or more, with the thermal conductivity of the magnetic layer as a reference (1.0). In addition, in the coating material having a thermal conductivity higher than a thermal conductivity of the magnetic layer the thermal conductivity can be, for example, 3.0 or less or 2.5 or less with the thermal conductivity of the magnetic layer as a reference (1.0), or it can exceed the values exemplified here.

For example, the coating material that coats one or more edge surfaces of a sheet-shaped magnetic layer having an upper surface, a lower surface, and four edge surfaces can be a coating material having a thermal conductivity higher than a thermal conductivity of the magnetic layer. More specifically, the coating material that coats one or more edge surfaces can be a coating material having a thermal conductivity higher than a thermal conductivity of the magnetic layer, where the thermal conductivity of the coating material that coats the other one or more edge surfaces is equal to or smaller than the thermal conductivity of the magnetic layer, or all of the edge surfaces coated with a coating material among the four edge surfaces can be coated with a coating material having a thermal conductivity higher than a thermal conductivity of the magnetic layer. Alternatively, all the four edge surfaces can be coated with a coating material having a thermal conductivity higher than a thermal conductivity of the magnetic layer. In one form, only a part of each of the edge surfaces can be coated with a coating material having a thermal conductivity higher than a thermal conductivity of the magnetic layer, and in another form, the entire surface can be coated with a coating material having a thermal conductivity higher than a thermal conductivity of the magnetic layer.

In addition, in one form, a part or whole of the coating material that coats the edge surface of the magnetic layer can be a conductive coating material. In the present invention and the present specification, regarding the coating material, the "conductivity" shall refer to that the resistivity $\rho$ is 1 $\Omega \cdot m$ or less, and the "insulating properties" shall refer to that such conductivity is not provided. The resistivity $\rho$ of the conductive coating material is 1 $\Omega \cdot m$ or less and can be, for example, 0.1 $\Omega \cdot m$ or less, where it is preferably 0.01 $\Omega \cdot m$ or less and more preferably 0.001 $\Omega \cdot m$ or less. The resistivity $\rho$ of the conductive coating material can be, for example, 0.2 $\Omega \cdot m$ or more or 0.5 $\Omega \cdot m$ or more, or it can be lower than the values exemplified here. The resistivity $\rho$ is a value calculated according to the following expression by measuring a resistance value R (unit: $\Omega$) of a measurement target and using a cross-sectional area S (unit: $m^2$) of the measurement target and a distance L [m] between electrodes. The resistance value R can be measured by using a known measuring device capable of measuring a resistance value, such as a commercially available digital multimeter. Specific examples of the measuring method for the resistivity $\rho$ include a method described for Examples described later can be used.

$$\text{Resistivity } \rho \text{ (unit: } \Omega \cdot m\text{)} = RS/L$$

As the conductive coating material, various metal foils, metal plates, conductive tapes, conductive adhesives, and the like can be used. It is preferable to use a conductive coating material from the following viewpoints. In a shielding material including a multilayer structure in which a magnetic layer containing magnetic particles is sandwiched between two metal layers, in a case where one outermost layer and the other outermost layer are both metal layers, the one metal layer can be conductively connected to the metal case in a case where the shielding material is attached to a metal case of an electronic circuit. However, since the other metal layer is generally disposed with the magnetic layer being interposed, which tends to have a large electric resistance, it is assumed that the conductive connection to the metal case cannot be obtained. In this case, the other metal layer described above is a so-called floating conductor, which can cause cavity resonance between the other metal layer and a signal wire of an electronic circuit and can cause strong noise. In addition, the other metal layer described above may be charged by the operation of the electronic circuit, which may cause a voltage increase or static electricity. Therefore, it is preferable that there is a conductive connection between the metal layers of the shielding material. Regarding this point, in order to ensure a conductive connection between metal layers, it is preferable that the coating material that coats the edge surface of the magnetic layer has conductivity, and it is more preferable that the conductive coating material is in contact with both one metal layer and the other metal layer. In the two metal layers, in a case where the resistance value between metal layers is 100$\Omega$ or less, it can be said that there is a conductive connection between the metal layers. In a case where there is a conductive connection between metal layers, the resistance value between metal layers can be, for example, 10$\Omega$ or less, where it is preferably 1$\Omega$ or less and more preferably 0.5$\Omega$ or less. The resistance value between metal layers can be, for example, 20$\Omega$ or more or 50$\Omega$ or more, or it can be lower than the values exemplified here. The resistance value between metal layers can be measured by using a known measuring device capable of measuring a resistance value, such as a commercially available digital multimeter. Specific examples of the measuring method for the resistance value between metal layers include a method described for Examples described later can be used.

For example, the coating material that coats one or more edge surfaces of a sheet-shaped magnetic layer having an upper surface, a lower surface, and four edge surfaces can be a conductive coating material. More specifically, the coating material that coats one or more edge surfaces can be a coating material, where the coating material that coats the other one or more edge surfaces can be an insulating conductive coating material, or all of the edge surfaces coated with a coating material among the four edge surfaces can be coated with a conductive coating material. Alternatively, all the four edge surfaces can be coated with a conductive coating material. In one form, only a part of each of the edge surfaces can be coated with a conductive coating material, and in another form, the entire surface can be coated with a conductive coating material. For the reasons described above, it is preferable that the entire surface of each of the four edge surfaces is coated with a conductive coating material having a thermal conductivity higher than a thermal conductivity of the magnetic layer.

[Electronic Component]

One aspect of the present invention relates to an electronic component including the electromagnetic wave shielding material. Examples of the electronic component include an electronic component included in an electronic apparatus such as a mobile phone, a mobile information terminal, and a medical device, and various electronic components such as a semiconductor element, a capacitor, a coil, and a cable. The electromagnetic wave shielding material can be bent into any shape, for example, according to the shape of the electronic component, thereby capable of being disposed in the inside of the electronic component or capable of being disposed as a cover material that covers the outside of the electronic component. Alternatively, it can be processed into a tubular shape and disposed as a cover material that covers the outside of the cable.

[Electronic Apparatus]

One aspect of the present invention relates to an electronic apparatus including the electromagnetic wave shielding material. Examples of the electronic apparatus include electronic apparatuses such as a mobile phone, a mobile information terminal, and a medical device, electronic apparatuses including various electronic components such as a semiconductor element, a capacitor, a coil, and a cable, and electronic apparatuses in which electronic components are mounted on a circuit board. Such an electronic apparatus can include the electromagnetic wave shielding material as a constitutional member of an electronic component included in the device. In addition, as a constitutional member of the electronic apparatus, the electromagnetic wave shielding material can be disposed in the inside of the electronic apparatus or can be disposed as a cover material that covers the outside of the electronic apparatus. Alternatively, it can be processed into a tubular shape and disposed as a cover material that covers the outside of the cable.

Examples of the usage form of the electromagnetic wave shielding material include a usage form in which a semiconductor package on a printed board is coated with a shielding material. For example, "Electromagnetic wave shielding technology in a semiconductor package" (Toshiba Review Vol. 67, No. 2 (2012) P. 8) discloses a method of obtaining a high shielding effect by electrically connecting a side via of an end part of a package substrate and an inner surface of a shielding material in a case where a semiconductor package is coated with a shielding material, thereby carrying out ground wiring. In order to carry out such wiring, it is desirable that the outermost layer of the shielding material on the electronic component side is a metal layer. Since the electromagnetic wave shielding material includes one or more multilayer structures having the magnetic layer between two metal layers, and one or both of outermost layers of the shielding material can be a metal layer, the electromagnetic wave shielding material can be suitably used in a case of carrying out the wiring as described above.

EXAMPLES

Hereinafter, the present invention will be described in more detail with reference to Examples. However, the present invention is not limited to the embodiments shown in Examples.

Example 1

<Preparation of Coating Liquid>

To a plastic bottle, the following substances were added and mixed with a shaking type stirrer for 1 hour to prepare a coating liquid;

100 g of Fe—Si—Al flat-shaped magnetic particles (Sendust MFS-SUH manufactured by MKT), 12 g of a polystyrene polybutadiene block copolymer (manufactured by Sigma-Aldrich Japan), and 205 g of cyclohexanone.

<Measurement of Glass Transition Temperature Tg of Resin>

The same resin (a pellet-shaped or powder-shaped specimen) as the resin used in the preparation of the coating liquid was placed in a specimen pan made of aluminum and sealed with a pressing machine, and the heat flow was measured under the following conditions using Q100 manufactured by TA Instruments as a differential scanning calorimeter. From the measurement results, the glass transition temperature of the resin was determined as the baseline shift start temperature in the heat flowchart at the time of temperature rise. The determined glass transition temperature Tg was −70° C.

(Measurement Conditions)

Scanning temperature: −80.0° C. to 200.0° C.

Temperature rising rate: 10.0° C./min

<Production of Magnetic Layer>

(Film Formation for Magnetic Layer)

A coating liquid was applied onto a peeling surface of a peeling-treated PET film (PET75TR manufactured by NIPPA Co., Ltd.) with a blade coater having a coating gap of 300 μm and dried for 30 minutes in a drying device having an internal atmospheric temperature of 80° C. to form a film of a sheet-shaped magnetic layer.

(Pressurization Treatment of Magnetic Layer)

Upper and lower press plates of a plate-shape pressing machine (a large-scale hot press TA-200-1 W manufactured by YAMAMOTO ENG. WORKS Co., LTD.) were heated to 140° C. (the internal temperature of the press plate), and the magnetic layer on the release film was installed in the center of the press plate together with the release film and held for 10 minutes in a state where a pressure of 4.66 N/mm$^2$ was applied. The upper and lower press plates were cooled to 50° C. (the internal temperature of the press plates) while maintaining the pressure, and then the magnetic layer was taken out together with the release film.

<Formation of Multilayer Structure>

A sample piece for each of the following measurement of magnetic permeability, the following measurement of electrical conductivity, and the following measurement of thermal conductivity was cut off from a part of the magnetic layer after the release film was peeled off. A double-sided tape (NeoFix 5 S2 manufactured by NEION Film Coatings Corp.) having a thickness of 5 μm was bonded to the upper and lower surfaces of the magnetic layer after the sample piece had been cut out, and then a rectangular magnetic layer having a size of 154 mm×154 mm was cut out from the magnetic layer after the sample piece had been cut out. A double-sided tape was bonded to each of the upper and lower surfaces of this magnetic layer, on which a copper foil (conforming to the JIS H3100: 2018 standard, alloy number: C1100R, copper content: 99.90% by mass or more) having a thickness of 10 μm and a rectangular shape of 150 mm×150 mm was bonded.

In this way, a laminate having a multi-layer structure of "copper foil (metal layer)/magnetic layer/copper foil (metal layer)" was produced. In the produced laminate, since the magnetic layer is larger than the copper foil as described above, the magnetic layer protrudes from the copper foil by 2 mm in each of the four side directions, and thus the two layers of the copper foil are not in contact with each other. FIG. 1 shows a schematic cross-sectional view of the above-described laminate. It is noted that FIG. 1 and other drawings are schematic views, where the magnitude relationship of dimensions (thickness and the like) of the various layers shown in the drawings is different from the actual magnitude relationship of the dimensions.

<Coating of Edge Surface of Magnetic Layer>

Figure 2:
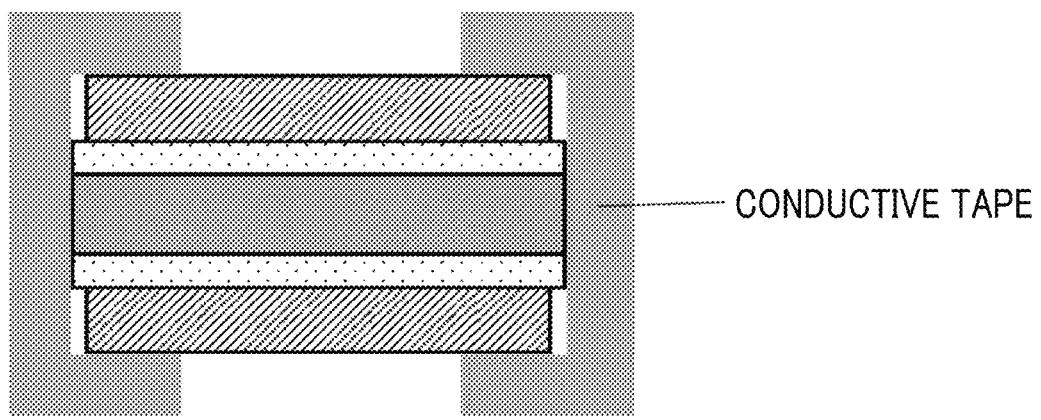
FIG. 2 shows a schematic cross-sectional view of the electromagnetic wave shielding material of Example 1.

FIG. 2 shows a schematic cross-sectional view of the electromagnetic wave shielding material of Example 1. An electromagnetic wave shielding material of Example 1 was produced according to the following method.

As a coating material, four tape pieces were cut out from a conductive tape (CU-35C manufactured by 3M Japan Limited, thickness: 51 μm). Each tape piece had a length of 154 mm and a width of 10 mm. The four side surfaces of the laminate were covered with these four tape pieces, and the tape pieces were bonded to the laminate as shown in the schematic cross-sectional view of FIG. 2. In this way, an electromagnetic wave shielding material of Example 1, in which all four edge surfaces of the magnetic layer of the laminate were coated with the coating material, was obtained. In the electromagnetic wave shielding material of Example 1, the coating material that coats the edge surface of the magnetic layer is in contact with surfaces of the respective two metal layers (the upper surface of the metal layer on the upper side and the lower surface of the metal layer on the lower side in a case where the surface on the upper side is referred to as an upper surface and the surface on the lower side is referred to as a lower surface in FIG. 2). In addition, the entire surface of each of all the four edge surfaces of the magnetic layer is coated with a coating material.

<Measurement of Magnetic Permeability of Magnetic Layer>

The magnetic layer was cut into a rectangle of 28 mm×10 mm, the magnetic permeability was measured using a magnetic permeability measuring apparatus (PER01 manufactured by KEYCOM Corporation), and the magnetic permeability was determined as the real part (μ') of the complex specific magnetic permeability at a frequency of 100 kHz. The determined magnetic permeability was 148.

<Measurement of Electrical Conductivity of Magnetic Layer>

A cylindrical main electrode having a diameter of 30 mm was connected to the negative electrode side of a digital super-insulation resistance meter (TR-811A manufactured by Takeda RIKEN Industries), a ring electrode having an inner diameter of 40 mm and an outer diameter of 50 mm was connected to the positive electrode side thereof, the main electrode was installed on a sample piece of the magnetic layer cut to a rectangle of 60 mm×60 mm, the ring electrode was installed at a position surrounding the main electrode, a voltage of 25 V was applied to both electrodes, and the surface electrical resistivity of the magnetic layer alone was measured. The electrical conductivity of the magnetic layer was calculated from the surface electrical resistivity and the following expression. The calculated electrical conductivity was $1.1 \times 10^{-2}$ S/m. As the thickness, the thickness of the magnetic layer, which had been determined according to the following method, was used.

Electrical conductivity [S/m]=1/(surface electrical resistivity [Ω]×thickness [m])

<Acquisition of Cross-Sectional Image of Shielding Material>

Cross-section processing was carried out to expose the cross-section of the shielding material of Example 1 according to the following method.

A shielding material cut out to a rectangle of 3 mm×3 mm was embedded in a resin, and a cross section of the shielding material was cut with an ion milling device (IM4000PLUS manufactured by Hitachi High-Tech Corporation).

The cross-section of the shielding material, which had been exposed in this way, was observed with a scanning electron microscope (SU8220, manufactured by Hitachi High-Tech Corporation) under the conditions of an acceleration voltage of 2 kV and a magnification of 100 times to obtain a backscattered electron image. From the obtained image, the thicknesses of the magnetic layer and the two metal layers were measured at five points based on the scale bar, and the arithmetic averages of the respective thicknesses were denoted as the thickness of the magnetic layer and the thickness of each of the two metal layers. The thickness of each of the various coating materials was determined in the same manner, and it was confirmed that the thickness was the thickness described above. The points described above also apply to Examples and Comparative Examples described below.

<Acquisition of Cross-Sectional Image of Magnetic Layer>

In a cross section of the shielding material of Example 1, which had been exposed by the cross-section processing in the same manner as described above, a portion of the magnetic layer was observed with a scanning electron microscope (SU8220, manufactured by Hitachi High-Tech Corporation) under the conditions of an acceleration voltage of 2 kV and a magnification of 1,000 times, thereby obtaining a backscattered electron image.

<Measurement of Aspect Ratio of Magnetic Particle and Alignment Degree of Flat-Shaped Particle>

Using the backscattered electron image acquired as above, the aspect ratio of the magnetic particles was determined according to the method described above, and the flat-shaped particles were specified from the value of the aspect ratio. As a result of determining, as described above, whether or not the magnetic layer contained flat-shaped particles as the magnetic particles, it was determined that the magnetic layer contains flat-shaped particles. Further, as a result of determining the alignment degree of the magnetic particles specified as the flat-shaped particles, according to the method described above, the alignment degree was 13°. In addition, an average value (arithmetic average) of the aspect ratios of all the particles specified as the flat-shaped particles was determined as the aspect ratio of the flat-shaped particles contained in the magnetic layer. The determined aspect ratio was 0.071.

Example 2

One entire surface of the four edge surfaces of the magnetic layer was coated with the conductive tape used in Example 1.

As a coating material for coating the other three edge surfaces, three tape pieces were cut out from an insulating tape (Vinyl tape No. 21 for electrical insulation, manufactured by Nitto Denko Corporation, thickness: 180 µm). Each tape piece had a length of 154 mm and a width of 10 mm. The entire surface of each of the other three edge surfaces was coated by these three tape pieces.

An electromagnetic wave shielding material of Example 2 was produced by the method described for Example 1, except for the above-described points.

Example 3

An electromagnetic wave shielding material of Example 3 was produced according to the method described for Example 1, except that the entire surface of each of the four edge surfaces of the magnetic layer was coated according to the following method by an aluminum foil with an adhesive layer (thickness including adhesive layer: 53 µm), which had been produced according to the following method.

<Production of Aluminum Foil with Adhesive Layer>

The following substances were mixed with a shaking type stirrer for 1 hour to prepare a coating liquid;
- 5 g of a polyurethane resin having a concentration of solid contents of 30% by mass (UR-8300, manufactured by TOYOBO Co., Ltd.), and
- 20 g of methyl ethyl ketone.

A coating liquid was applied onto one surface of an aluminum foil (conforming to the JIS H4160: 2006 standard, alloy number: 1N30 with temper designation of (1)O, Al content: 99.3% by mass or more) having a thickness of 50 µm with a blade coater having a coating gap of 100 µm and dried for 30 minutes in a drying device having an internal atmospheric temperature of 80° C. to obtain an aluminum foil with an adhesive layer. The thickness of the adhesive layer was 3 µm.

<Coating of Edge Surface of Magnetic Layer>

As a coating material, an aluminum foil piece with an adhesive layer (also simply described as an "aluminum foil piece") was cut out from the above-described aluminum foil with an adhesive layer. Each aluminum foil piece had a length of 154 mm and a width of 10 mm. In a state where the entire surface of each of the four edge surfaces of the laminate having a multilayer structure, where the laminate had been produced by the method described for Example 1, was coated with the four aluminum foil pieces having the adhesive layer facing inward, was coated by four aluminum foil pieces in which the adhesive layer faced inward, the upper and lower press plates were installed in the center of a press plate of a plate-shape pressing machine (a large-scale hot press TA-200-1 W manufactured by Yamamoto Eng. Works Co., Ltd.) which had been heated to 140° C. (the internal temperature of the press plate), and were held for 10 minutes in a state where a pressure of 4.66 N/mm² was applied, whereby the laminate and the aluminum foil piece were adhered to each other. The upper and lower press plates were cooled to 50° C. (the internal temperature of the press plates) while maintaining the pressure. In this way, an electromagnetic wave shielding material of Example 3 was obtained.

Example 4

An electromagnetic wave shielding material of Example 4 was prepared according to the method described for Example 1, except that one entire surface of the four edge surfaces of the magnetic layer was coated by the aluminum foil with an adhesive layer, which had been used in Example 3, and the entire surface of each of the other three edge surfaces was coated by the insulating tape used in Example 2.

Example 5

An electromagnetic wave shielding material of Example 5 was prepared according to the method described for Example 1, except that the entire surface of each of the four edge surfaces of the magnetic layer was coated by the insulating tape used in Example 2.

Comparative Example 1

An electromagnetic wave shielding material of Comparative Example 5 was prepared according to the method described for Example 1, except that the four edge surfaces of the magnetic layer were not coated.

Comparative Example 2

A laminate in which two layers of a magnetic layer and a metal layer were laminated was produced according to the method described for the production of the laminate having a multilayer structure in Example 1, except that the metal layer (the copper foil) was disposed on only one side of the magnetic layer. This laminate was used as an electromagnetic wave shielding material of Comparative Example 2.

[Evaluation Method]

<Evaluation of Electromagnetic Wave Shielding Ability (KEC Method)>

The electromagnetic wave shielding ability of the electromagnetic wave shielding material of each of Examples and Comparative Examples was evaluated according to the following methods.

An electromagnetic wave shielding material was installed between antennas of a KEC method evaluation device including a signal generator, an amplifier, a pair of magnetic field antennas, and a spectrum analyzer, and at a frequency of 100 kHz to 1 GHz, a ratio of the intensity of the received signal in a case where the electromagnetic wave shielding material was not present to the intensity of the received signal in a case where the electromagnetic wave shielding material was present was determined and denoted as the shielding ability. The operation was carried out with the magnetic field antenna to determine the magnetic field wave shielding ability. In Table 1, the column in which the electromagnetic wave shielding ability is indicated as a numerical value with "or more" indicates that it is equal to or higher than the upper limit of evaluation of the KEC method evaluation device used. It is noted that KEC is an abbreviation for Kansai Electronic Industry Development Center.

<Attachment Test>

Figure 3:
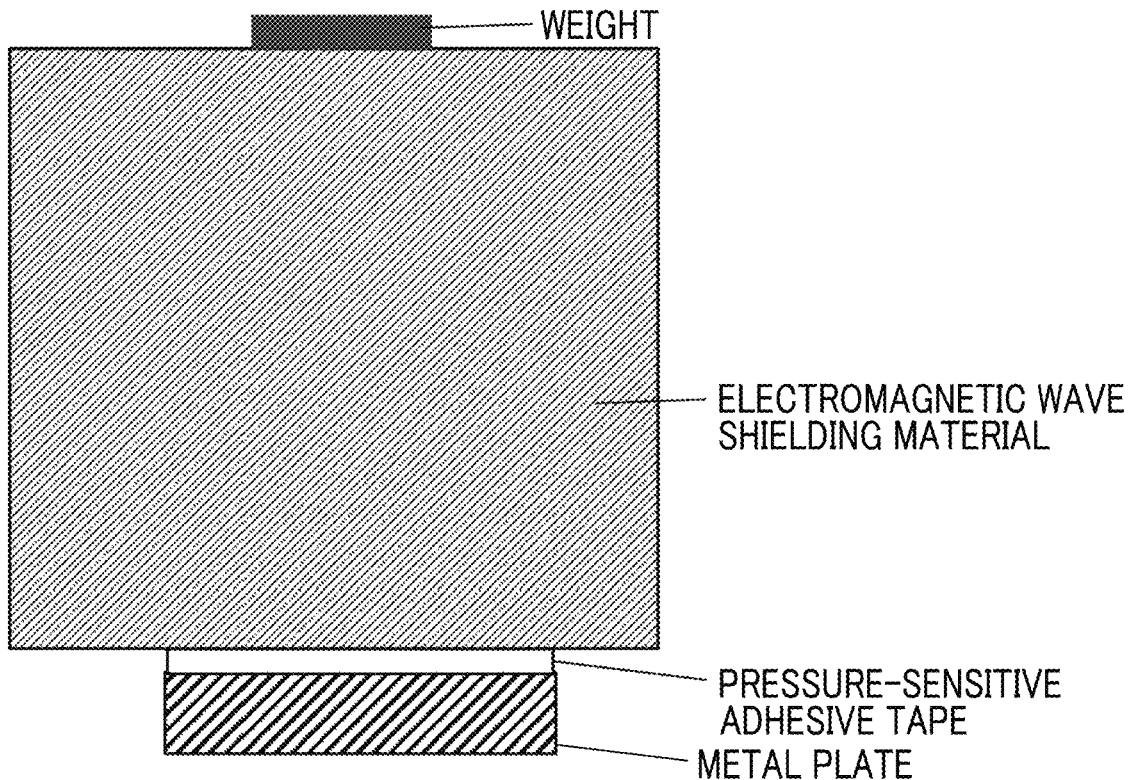
FIG. 3 shows an explanatory view for an attachment test.

FIG. 3 shows an explanatory view for an attachment test.

For the electromagnetic wave shielding material of each of Examples and Comparative Examples, a test of adhesion of magnetic particles to a pressure-sensitive adhesive tape was carried out according to the following method.

A pressure-sensitive adhesive tape (CELLOTAPE (registered trade name), manufactured by NICHIBAN CO., LTD., width 18 mm) was cut into a length of 100 mm and fixed on a metal plate with the pressure-sensitive adhesive tape facing upward.

A region having a length of 100 mm in the vicinity of the center of one surface of the four side surfaces of the electromagnetic wave shielding material was held while being pressed against the pressure-sensitive adhesive surface of the pressure-sensitive adhesive tape, and a weight having a weight of 100 g was placed and held at the center of the opposite side surface. After being held for 10 seconds, the weight and the electromagnetic wave shielding material were removed, and the surface of the pressure-sensitive adhesive surface of the pressure-sensitive adhesive tape was displayed at a magnification of 15 times, and the presence or absence of attachments was observed using a microscope (MMS-500 manufactured by Niigata Seiki Co., Ltd.) and image display software (MicroCapture Plus manufactured by Niigata Seiki Co., Ltd.).

Based on the results of subjecting each of the four side surfaces to the above-described step, a case where attachments were not observed on all the side surfaces was evaluated as "not attached", and a case where attachments were observed on one or more side surfaces was evaluated as "attached".

<Measurement of Thermal Conductivity of Magnetic Layer and Coating Material>

Figure 4:
FIG. 4 shows an explanatory view of a measuring method for thermal conductivity.
Figure 4:
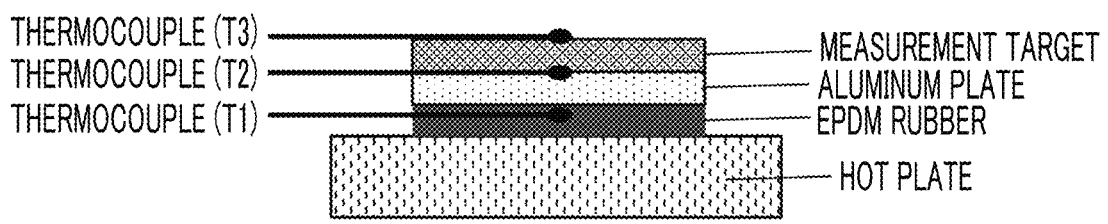

FIG. 4 shows an explanatory view of a measuring method for thermal conductivity.

According to the following method, the thermal conductivity of the sample piece of the magnetic layer, which had been obtained according to the method described above, and the thermal conductivity of each coating material were determined.

A notch having a width of 2 mm was made at the center from one side of an ethylene propylene diene (EPDM) rubber sheet (manufactured by Akitsu Industry Co., Ltd.) having a size of 50 mm×50 mm and a thickness of 1 mm and installed on a hot plate (SCP-125 manufactured by AS ONE Corporation), and then one K thermocouple (referred to as "T1") attached to a thermocouple thermometer (AD-5602A manufactured by A&D Company, Limited) was inserted into the notch.

An aluminum plate (A1050P manufactured by Hikari Co., Ltd.) having a size of 50 mm×50 mm and a thickness of 1 mm was installed on an EPDM rubber sheet, one K thermocouple (referred to as "T2") attached to a thermocouple thermometer (AD-5602A manufactured by A&D Company, Limited) was installed at a position deviated from the center by 5 mm, and the coating part in the vicinity of the junction point of the thermocouple was fixed to an aluminum plate using a pressure-sensitive adhesive tape (Kapton (registered trade name)) manufactured by Teraoka Seisakusho Co., Ltd.) cut into a rectangle of 10 mm×2 mm.

A measurement target (the sample piece of the magnetic layer, which had been obtained according to the method described above, or each coating material) which had been cut into a rectangle of 50 mm×50 mm was installed on an aluminum plate, one K thermocouple (referred to as "T3") attached to a thermocouple thermometer (AD-5602A manufactured by A&D Company, Limited) was installed at a position deviated from the center by 5 mm in a direction opposite to the direction of T2, and the coating part in the vicinity of the junction point of the thermocouple was fixed to the measurement target using a pressure-sensitive adhesive tape (Kapton, manufactured by Teraoka Seisakusho Co., Ltd.) cut into a rectangle of 10 mm×2 mm.

Using a pressure-sensitive adhesive tape (Kapton, manufactured by Teraoka Seisakusho Co., Ltd.) cut into a rectangle of 20 mm×2 mm, the measurement target was fixed to a hot plate at a position of 5 mm from each of the four corners of the measurement target.

15 liters per minute of air having a normal temperature (23° C.) was ejected toward the measurement target from an air hose having an inner diameter of 4 mm, which was installed directly above the measurement target, and the set temperature of the hot plate was set to 65° C. and heating was carried out while cooling the center of the measurement target. It was regarded as reaching a steady state at a timing when a temperature change of each of the thermometers T1, T2, and T3 was 1° C. or lower per minute, and from the temperatures T1 [° C.], T2 [° C.], T3 [° C.] at the respective positions and the thickness d [μm] of the measurement target in the steady state, the thermal conductivity was determined using the following expression, where KAl was the thermal conductivity of the aluminum plate.

Thermal conductivity of measurement target=KAl×
 $d\times(T2-T1)/(500\times(T3-T2))$ According to the method described above, the thermal conductivity of each of the magnetic layer and the coating material, which were included in the specimen for measuring thermal conductivity, was determined. The thermal conductivity of the coating material was obtained as a relative value, where the thermal conductivity of the magnetic layer was set to 1.0.

<Measurement of Thermal Conductivity of Electromagnetic Wave Shielding Material>

The thermal conductivity of the electromagnetic wave shielding material of Example 1 was measured according to the following method.

After producing the magnetic layer according to the method described above, a double-sided tape (NeoFix 5 S2 manufactured by NEION Film Coatings Corp.) having a thickness of 5 μm was bonded to the upper and lower surfaces of the magnetic layer from which the release film had been peeled off, followed by cutting into a rectangle of 50 mm×50 mm. Further, a copper foil having a thickness of 10 μm, which had been cut into a rectangle of 46 mm×46 mm, was bonded to the upper and lower surfaces of the magnetic layer, with a double-sided tape being interposed, to form a laminate (hereinafter, referred to as a "laminate for measuring thermal conductivity"). Since the magnetic layer is larger than the copper foil as described above, the magnetic layer protrudes from the copper foil by 2 mm in each of the four side directions, and thus the two layers of the copper foil are not in contact with each other.

The conductive tape (CU-35C manufactured by 3M Japan Limited) was cut into a length of 50 mm and a width of 10 mm, and the entire surface of each of the four edge surfaces of the laminate for measuring thermal conductivity was coated by this conductive tape to obtain a specimen for measuring thermal conductivity.

The thermal conductivity of the specimen for measuring thermal conductivity was measured according to the method described for the measurement of the thermal conductivity of the magnetic layer and the coating material. The thermal conductivity of the laminate for measuring thermal conductivity, which had been produced by the above-described method, was measured according to the same method, and the thermal conductivity obtained by this measurement was used as the thermal conductivity of the electromagnetic wave shielding material of Comparative Example 1. The thermal conductivity of the electromagnetic wave shielding material of Example 1 was determined as a relative value, where the thermal conductivity of the electromagnetic wave shielding material of Comparative Example 1 was set to 1.0. The same applied to Examples 2 to 5 and Comparative Examples 1 and 2.

In Examples 2 to 5, each specimen for measuring thermal conductivity was prepared according to the above-described method, except that the above-described coating material was used as the coating material that coats the entire surface of each of the four edge surfaces of the laminate for thermal conductivity measurement. The thermal conductivity of the prepared specimen for measuring thermal conductivity was measured according to the above-described method. The thermal conductivity measured in this way was used as the thermal conductivity of the electromagnetic wave shielding materials of Examples 2 to 5.

In Comparative Example 2, after producing the magnetic layer according to the method described above, a double-sided tape (NeoFix 5 S2 manufactured by NEION Film Coatings Corp.) having a thickness of 5 μm was bonded to only one of the upper and lower surfaces of the magnetic layer from which the release film had been peeled off, followed by cutting into a rectangle of 50 mm×50 mm. Further, a copper foil having a thickness of 10 μm, which had been cut into a rectangle of 46 mm×46 mm, was bonded to only one of the upper and lower surfaces of the magnetic layer, with a double-sided tape being interposed, to obtain a laminate. The thermal conductivity of the obtained laminate was measured according to the above-described method. The thermal conductivity measured in this way was used as the thermal conductivity of the electromagnetic wave shielding material of Comparative Example 2.

<Measurement of Resistivity of Coating Material>

The resistivity of the conductive tape (CU-35C manufactured by 3M Japan Limited) which had been used as the coating material described above was measured according to the following method.

Two probes of a digital multimeter (KU-2608 manufactured by KAISE CORPORATION) were brought into contact with a surface of the conductive tape cut into a size of 20 mm×5 mm on the pressure-sensitive adhesive layer side to measure a resistance value. One probe was brought into contact with a center position in the width direction by 5 mm inside from one end in the longitudinal direction, and the other probe was brought into contact with a center position in the width direction by 5 mm inside from the other end in the longitudinal direction. The measurement limit in the digital multimeter used here is 40 MΩ, and the distance L between electrodes is 0.01 m. A cross-sectional area S of the measurement target, which is determined from the "thickness×width", is $2.55 \times 10^{-5}$ m$^2$.

The resistance value of the insulating tape (Vinyl tape No. 21 for electrical insulation, manufactured by Nitto Denko Corporation) which had been used as the coating material in the above description was measured according to the method described above, by bringing two probes of the digital multimeter into contact with the surface of the insulating tape on the pressure-sensitive adhesive layer side.

The resistance value R of the aluminum foil with an adhesive layer, which had been used as the coating material in the above description, was measured according to the method described above by bringing two probes of the digital multimeter into contact with the surface on the adhesive layer side. The resistivity was determined from the resistance value R, the distance L between electrodes, and the cross-sectional area S of the measurement target, according to the following expression.

Resistivity ρ (unit: Ω·m)=$RS/L$

Measurement of Resistance Value Between Metal Layers

For the electromagnetic wave shielding material of each of Examples 1 to 5, Comparative Example 1, and Comparative Example 2, one probe of a digital multimeter (KU-2608 manufactured by KAISE CORPORATION) was brought into contact with the center of the outer surface of one metal layer of the electromagnetic wave shielding material, and the other probe was brought into contact with the center of the outer surface of the metal layer on the opposite side to measure the resistance value. The measurement limit in the digital multimeter is 40 MΩ. In a case where the measurement result was equal to or larger than the measurement limit, the measurement result was described as "Equal to or larger than measurement limit" in Table 1.

The above results are shown in Table 1. Table 2 shows the thermal conductivity and the resistance value of each of the coating materials used above. In Table 2, "Equal to or larger than measurement limit" indicates that the measurement result of the resistance value R is equal to or larger than the measurement limit in the digital multimeter.

TABLE 1

| | Layer configuration (A gap between layer is adhered with a double-sided tape having a thickness of 5 μm) | Coating of edge surface of magnetic layer | Electromagnetic wave shielding ability Magnetic field wave shielding ability [dB] | | | Attachment test | Shielding material Thermal conductivity [-] | Resistance value between metal layers [Ω] |
|---|---|---|---|---|---|---|---|---|
| | | | 10 kHz | 10 MHz | 1 GHz | | | |
| Example 1 | Copper layer 10 μm/magnetic layer 30 μm/copper layer 10 μm | Conductive tape (four edge surfaces) | 14.3 | 79.2 | 97 or more | Not attached | 1.4 | 0.2 |
| Example 2 | Copper layer 10 μm/magnetic layer 30 μm/copper layer 10 μm | Conductive tape (one edge surface), insulating tape (three edge surfaces) | 14.1 | 79.0 | 97 or more | Not attached | 1.2 | 0.2 |
| Example 3 | Copper layer 10 μm/magnetic layer 30 μm/copper layer 10 μm | Aluminum foil attached with adhesive layer (four edge surfaces) | 14.1 | 79.0 | 97 or more | Not attached | 1.3 | Equal to or larger than measurement limit |

TABLE 1-continued

| | Layer configuration (A gap between layer is adhered with a double-sided tape having a thickness of 5 μm) | Coating of edge surface of magnetic layer | Electromagnetic wave shielding ability Magnetic field wave shielding ability [dB] | | | Attachment test | Shielding material Thermal conductivity [-] | Resistance value between metal layers [Ω] |
|---|---|---|---|---|---|---|---|---|
| | | | 10 kHz | 10 MHz | 1 GHz | | | |
| Example 4 | Copper layer 10 μm/magnetic layer 30 μm/copper layer 10 μm | Aluminum foil attached with adhesive layer (one edge surface), insulating tape (three edge surfaces) | 14.1 | 79.0 | 97 or more | Not attached | 1.1 | Equal to or larger than measurement limit |
| Example 5 | Copper layer 10 μm/magnetic layer 30 μm/copper layer 10 μm | Insulating tape (four edge surfaces) | 14.2 | 79.3 | 97 or more | Not attached | 1.0 | Equal to or larger than measurement limit |
| Comparative Example 1 | Copper layer 10 μm/magnetic layer 30 μm/copper layer 10 μm | Absent | 14.2 | 79.4 | 97 or more | Attached | 1.0 | Equal to or larger than measurement limit |
| Comparative Example 2 | Magnetic layer 30 μm/copper layer 10 μm | Absent | 8.5 | 44.6 | 97 or more | Attached | 1.0 | — |

TABLE 2

| | Thermal conductivity [-] | Resistivity [Ω · m] |
|---|---|---|
| Conductive tape | 1.9 | 0.00051 |
| Insulating tape | 1.0 | Equal to or larger than measurement limit |
| Aluminum foil attached with adhesive layer | 1.3 | Equal to or larger than measurement limit |

From the results shown in Table 1, the following points can be confirmed.

In the electromagnetic wave shielding materials of Examples 1 to 5, since the edge surface of the magnetic layer is covered with the coating material, the result is "not attached" in the attachment test. For example, in an electronic component or an electronic apparatus, in a case where magnetic particles fall off from the electromagnetic wave shielding material due to aged deterioration or the like, the magnetic particles can adhere to a circuit, thereby causing the deterioration of the performance of the electronic component or the electronic apparatus. On the other hand, in the case of the electromagnetic wave shielding materials of Examples 1 to 5, the magnetic particles hardly fall off from the electromagnetic wave shielding material after being incorporated into the electronic component or the electronic apparatus, which hardly causes the deterioration of the performance of the electronic component or the electronic apparatus. This fact is preferable from the viewpoint of improving the reliability of the electronic component and the electronic apparatus.

In Examples 1 to 4 in which a coating material having a thermal conductivity higher than a thermal conductivity of the magnetic layer was used as the coating material, the thermal conductivity of the electromagnetic wave shielding material was more than 1.0. A shielding material having such a high thermal conductivity can exhibit excellent heat radiation properties.

In Example 1 and Example 2 in which a conductive coating material was used as the coating material, the resistance value between metal layers was lower than those in the other Examples and Comparative Example 1. From the points described above, it is preferable that the resistance value between metal layers is low as described above, that is, the conductive connection is achieved between the metal layers.

One aspect of the present invention is useful in the technical fields of various electronic components and various electronic apparatuses.

What is claimed is:

1. An electromagnetic wave shielding material comprising:
   a multilayer structure having a magnetic layer containing magnetic particles, between two metal layers,
   wherein a part or whole of an edge surface of the magnetic layer is coated with a coating material, and
   a part or whole of the coating material is a coating material having a thermal conductivity higher than a thermal conductivity of the magnetic layer.

2. The electromagnetic wave shielding material according to claim 1, wherein a part or whole of the coating material is a conductive coating material.

3. The electromagnetic wave shielding material according to claim 1,
   wherein the magnetic layer has a sheet shape having an upper surface, a lower surface, and four edge surfaces,
   a surface of one metal layer of the two metal layers faces the upper surface, and a surface of the other metal layer thereof faces the lower surface, and
   a part or entire surface of one or more edge surfaces of the four edge surfaces is coated with the coating material.

4. The electromagnetic wave shielding material according to claim 2,
   wherein an entire surface of each of the four edge surfaces is coated with the coating material.

5. The electromagnetic wave shielding material according to claim 1,
   wherein the magnetic layer has a sheet shape having an upper surface, a lower surface, and four edge surfaces,
   a surface of one metal layer of the two metal layers faces the upper surface, and a surface of the other metal layer thereof faces the lower surface, and
   a part or entire surface of one or more edge surfaces of the four edge surfaces is coated with a conductive coating material.

6. The electromagnetic wave shielding material according to claim 1,
   wherein the magnetic layer has a sheet shape having an upper surface, a lower surface, and four edge surfaces,
   a surface of one metal layer of the two metal layers faces the upper surface, and a surface of the other metal layer thereof faces the lower surface, and a part or entire surface of one or more edge surfaces of the four edge surfaces is coated with a coating material having a thermal conductivity higher than a thermal conductivity of the magnetic layer.

7. The electromagnetic wave shielding material according to claim 1,
wherein the magnetic layer has a sheet shape having an upper surface, a lower surface, and four edge surfaces,
a surface of one metal layer of the two metal layers faces the upper surface, and a surface of the other metal layer thereof faces the lower surface, and
an entire surface of each of the four edge surfaces is coated with a conductive coating material having a thermal conductivity higher than a thermal conductivity of the magnetic layer.

8. The electromagnetic wave shielding material according to claim 1,
wherein the magnetic particles includes metal particles.

9. The electromagnetic wave shielding material according to claim 1,
wherein the magnetic layer further contains a resin.

10. An electronic component comprising:
the electromagnetic wave shielding material according to claim 1.

11. An electronic apparatus comprising:
the electromagnetic wave shielding material according to claims 1.

* * * * *